United States Patent
Shimoda

(10) Patent No.: US 6,968,435 B2
(45) Date of Patent: Nov. 22, 2005

(54) NON-VOLATILE SEMICONDUCTOR MEMORY DEVICE

(75) Inventor: Hiroshi Shimoda, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 369 days.

(21) Appl. No.: 10/418,046

(22) Filed: Apr. 18, 2003

(65) Prior Publication Data

US 2003/0204689 A1    Oct. 30, 2003

(30) Foreign Application Priority Data

Apr. 24, 2002  (JP) .............................. 2002-122830

(51) Int. Cl.$^7$ ............................................ G06F 12/02
(52) U.S. Cl. ...................................................... 711/165
(58) Field of Search ............................... 711/103, 165; 710/22, 23

(56) References Cited

U.S. PATENT DOCUMENTS

| | | | |
|---|---|---|---|
| 5,715,423 A * | 2/1998 | Levy ........................... | 711/103 |
| 6,040,997 A * | 3/2000 | Estakhri ................ | 365/185.33 |
| 6,201,736 B1 * | 3/2001 | Komatsu ............... | 365/185.12 |
| 6,272,587 B1 * | 8/2001 | Irons .......................... | 711/103 |
| 6,809,964 B2 * | 10/2004 | Moschopoulos et al. ...................... | 365/185.11 |
| 2002/0120820 A1 * | 8/2002 | Higuchi et al. ............ | 711/154 |
| 2003/0181994 A1 * | 9/2003 | Mizoguchi .................... | 700/2 |

FOREIGN PATENT DOCUMENTS

JP            2001-6379         1/2001

* cited by examiner

Primary Examiner—Kevin L. Ellis
(74) Attorney, Agent, or Firm—McGinn IP Law Group, PLLC

(57) ABSTRACT

A non-volatile semiconductor memory device according to the invention includes a copy area latch circuit for latching information therein, a copy source address latch circuit for latching therein information read from a copy source, and write control means for comparing the information latched in the copy area latch circuit and the information latched in the copy source address latch circuit with each other, and automatically copying data latched in a source area of the copy source to a destination area of a copy destination, the destination area corresponding to the source area, until the information latched in the copy area latch circuit and the information latched in the copy source address latch circuit become coincide with each other following implementation of a newly provided copy command when data is copied from external storage means as a copy source to a non-volatile memory.

17 Claims, 13 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, and particularly to a non-volatile semiconductor memory device configured to perform a write operation in such an improved manner that when data is copied from sequential storage area within a storage device as a copy source coupled to the memory device from the outside of the memory device to sequential storage area within a non-volatile semiconductor storage means as a copy destination within the memory device.

2. Description of Related Art

With the recent progress in microfabrication techniques, miniaturization of semiconductor elements has been enhanced and accordingly, an LSI consisting of the semiconductor elements has been becoming larger in size, and particularly, an LSI semiconductor memory has extensively, been becoming larger.

For instance, a dynamic random access memory (DRAM) or a synchronous dynamic random access memory (SDRAM) as a semiconductor memory having a storage capacity of 256 mega-bits in one chip has become commercially available. Although the aforementioned memories are a volatile semiconductor memory device, a variety of devices such as a read only memory (ROM) used to only read data therefrom, an EEPROM and a flash memory, both allowing electrical re-write of data, can be used as a non-volatile memory device and all those memories have been developed to have larger storage capacity. In this case, a flash memory refers to a flash EEPROM as an EEPROM capable of electrically erasing at one time data within each block or at one time data corresponding to all bits.

Since the flash memory is advantageously able to have larger storage capacity, the flash memory is not limited in its application to a conventional EEPROM (UV-EPROM) for storage of a program for controlling a computer system or an electronic equipment but has widely been used, utilizing its large storage capacity, such as in a digital still camera or a mobile equipment.

Furthermore, in an EEPROM, erase and write operations are performed in unit of 1 byte. In contrast, in a flash memory, an erase operation is performed in unit of block and further a write operation is performed in unit of 1 byte. A flash memory writes data about 1000 times faster than an EEPROM does and is suitably used in data storage application such as a disk, utilizing its ability to write data at high speed.

When a write operation or an erase operation is performed on a flash memory, a control command such as a write command or an erase command is supplied to the flash memory and then the flash memory performs operation following the command.

In general, one functional operation is performed in two cycles, i. e., a cycle for inputting a command code used in an operation mode and a cycle for inputting the contents of data.

A conventional write operation of this type performed on a flash memory and associated with the invention is constructed such that data is automatically written to an associated memory cell inside the memory and then verification is made to verify whether the data is written. In this case, since a time interval required for writing the data to the memory cell is not constant, the time when the write operation has completed is not constant accordingly.

Referring to FIG. 13 illustrating a timing chart to explain a write operation performed on the conventional flash memory, data indicative of an auto write command is represented by, for example, 4 cycles, AAh, 55h, A0h and PD. Though not shown herein, addresses corresponding to those cycles are assumed to be 555, 2AA, 555 and PA. Note that PD denotes program data and PA denotes a program address.

A read operation is performed when a Ready/Busy# signal indicative of operating status of the flash memory is being at a logical high level (Ready) and a write operation is performed when the signal is being at a logical low level (Busy#). In this case, when the number of write operations reaches a specific limitation value, additional number of write operations need to be limited to a small value even if the data stored in a memory cell and the program data PD do not coincide with each other. The write duration ranges from about 11 microseconds to about 200 microseconds and is not constant.

For this reason, when write operations are performed on sequential addresses, whether the write operation has completed is verified outside the memory and upon verification of completion of the operation, a write operation is performed on the subsequent address. This imposes burden on the verification of completion, the write command and further a control circuit.

Furthermore, recently, a multi-chip package has become commercially available and then a flash memory chip and an SRAM chip have been incorporated together in one package, increasing the need for write function provided by the invention.

An example of the conventional flash memory, associated with the invention, of this type is disclosed in Japanese Patent Application 2001-6379. Referring to FIG. 14 illustrating the configuration of the flash memory disclosed in the publication, the flash memory comprises: 4 cell blocks CBL0 to CBL3; an address buffer 910 for receiving addresses A0 to A19; and address latch circuits 911 for latching addresses A0 to A19 via the address buffer 910. The address latch circuits 911 are provided to correspond to the individual cell blocks and to latch addresses corresponding to the individual cell blocks.

The flash memory further includes: a command input circuit 912 for receiving a specific control signal CNT and a command signal supplied via the address buffer 910 and a data input/output buffer 916; and a control circuit 913 to which the received command signal of predetermined bits is supplied.

The control circuit 913 controls internal circuits so that the internal circuits perform a later described copy operation and move and integration operations in addition to write (program), erase and read operations that are performed in the conventional flash memory. The remaining configuration of the flash memory is omitted herein for convenience.

In the conventional flash memory, for example, in case of copy operation, a data copy command is input to the command input circuit 912. Then, the address of a cell block from which data is to be copied (hereinafter, a memory location from which data is to be copied is referred to as a copy source) is input to the circuit 912.

Subsequently, the data copy command is supplied to the control circuit 913 and then the address of a cell block as a copy source is supplied to the circuit 913. The address of a cell block to which data is to be copied (hereinafter, a memory location to which data is to be copied is referred to as a copy destination) is latched in the address latch circuit 911.

Data stored in the cell block as a copy destination is sequentially read by a sequence program within the control circuit 913 and is inspected whether bits indicative of data within the cell block are all in an erased state (data "1"). When the bits are not all in an erased state, the data stored in the corresponding cell block is erased following the conventional erase operation.

Upon completion of the erasing of the individual data bits stored in the cell block as a copy destination, the data stored in the cell block as a copy source is read. The read data is latched in a data latch circuit 915 and the read data being latched therein is written to the cell block as a copy destination.

A data read operation is repeatedly performed on the cell block as a copy source until the read operation is performed on all bits within the cell block, and a write operation is repeatedly performed on the cell block as a copy destination until the write operation is performed on all bits within the cell block.

The copy operation is comprised of verification of the erased state of a cell block as a copy destination, incrementation of addresses within cell blocks as a copy source and a copy destination, and control of incrementation of addresses within a cell block as a copy destination, and the remainder of the copy operation is realized by the combination of the conventional read, erase, write operations.

As described above, a write operation is performed on the conventional non-volatile semiconductor memory so that data is automatically written inside the memory and a verification operation is performed to verify the written data. However, since a time interval required to write data to a memory cell is not constant, the time when the write operation has completed is undesirably not constant.

Furthermore, when a write operation is performed on sequential addresses, completion of the write operation is verified outside the memory and upon verification of completion of the operation, the subsequent write operation is performed on the subsequent address, undesirably imposing burden on the verification of completion of the operation, the write command and further the control circuit.

Moreover, since the exemplary memory disclosed in Japanese Patent Application 2001-6379 does not have means for allocating an area to which data is written, the address latch circuits 911 need to be provided corresponding to individual cell blocks, increasing the number of components constituting the memory and the size of chip incorporating therein the memory.

SUMMARY OF THE INVENTION

A non-volatile semiconductor memory device according to the invention includes: a copy area latch circuit for latching information therein; a copy source address latch circuit for latching therein information read from a copy source; and write control means for comparing the information latched in the copy area latch circuit and the information latched in the copy source address latch circuit with each other, and automatically copying data latched in a source area of the copy source to a destination area of a copy destination, the destination area corresponding to the source area, until the information latched in the copy area latch circuit and the information latched in the copy source address latch circuit become coincide with each other following implementation of a newly provided copy command when data is copied from external storage means as a copy source to a non-volatile memory.

DETAILED DESCRIPTION OF THE PREFERRED EMBODIMENTS

Figure 1:
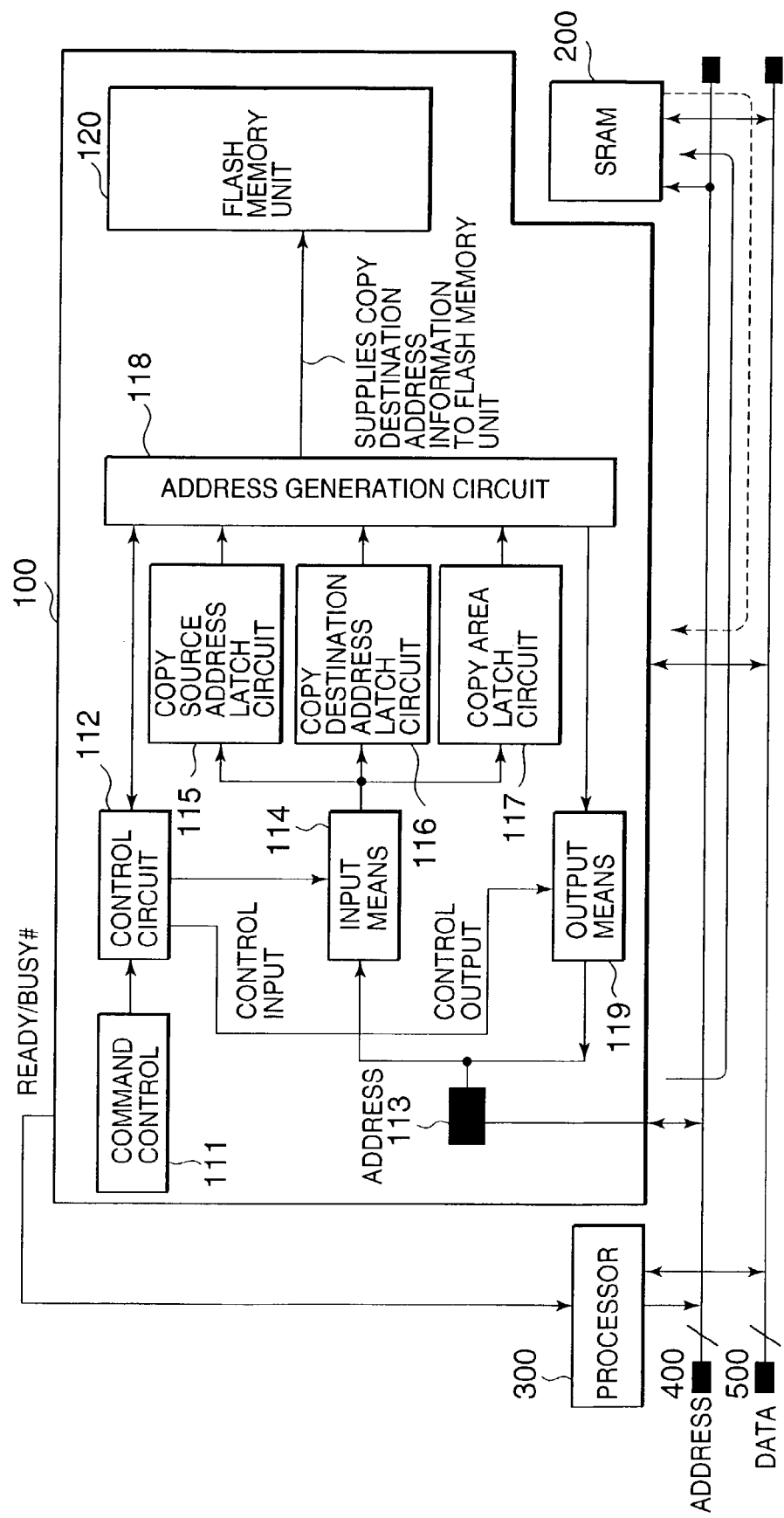
FIG. 1 is a diagram illustrating the configuration of a first embodiment of the invention.

A first embodiment of a non-volatile semiconductor memory device, i. e., a flash memory as an example, according to the present invention will be explained with reference to the accompanying drawings. Referring to FIG. 1 illustrating a block diagram of the primary configuration of the first embodiment, a flash memory 100 is configured to have a storage device, denoted by, for example, an SRAM 200, as a copy source for storing therein data to be copied and a processor 300 for controlling the entire system, those two components being coupled to the flash memory and located outside the flash memory, and those three primary components are in communication with one another via an address bus 400 and a data bus 500.

Furthermore, the flash memory 100 outputs a Ready/Busy# signal to the processor 300. The Ready/Busy# signal is at a low level (Busy#) during write operation and changes to a high level (Ready) when the memory is not performing a write operation, i. e., the memory is in a non-auto mode. Note that the sign "#" indicates the signal is being at a low level.

The flash memory 100 includes: a command control circuit 111 for receiving a command issued by the processor 300 that is coupled to the memory and located outside the memory via the address bus 400 and the data bus 500 and decoding the command, and then, outputting the same; and a control circuit 112 for performing internal control processing in order to automatically implement write and read operations in response to a control signal output from the command control circuit 111.

The flash memory 100 further includes: a common address terminal 113 used to receive address information from the processor 300 that is coupled to and located outside the memory, and output address information to the SRAM 200 that is coupled to and located outside the memory; and input means 114 for outputting the address information supplied from the processor 300 via the common address terminal 113 as copy destination address information, copy source address information and copy area information (data size) in response to an input control signal output from the control circuit 112.

The flash memory 100 still further includes: a copy source address latch circuit 115 for receiving the copy source address information from the input means 114 and latching the information; a copy destination address latch circuit 116 for receiving the copy destination address information from the input means 114 and latching the information; and a copy area latch circuit 117 for receiving the copy area information from the input means 114 and latching the information.

The flash memory 100 still further includes: an address generation circuit 118; output means 119; and a flash memory unit 120 as a copy destination. The address generation circuit 118 receives the copy source address information, the copy destination address information and the copy area information (data size) from the copy source address latch circuit 115, the copy destination address latch circuit 116 and the copy area latch circuit 117, respectively, and generates a destination address (i.e., a location to which data is to be copied is written) of a copy destination and outputs a source address (i. e., a location from which data is to be copied is read) of a copy source in response to a control signal from the control circuit 112.

When the write to the flash memory unit 120 as a copy destination has completed, in response to a control signal from the control circuit 112, the flash memory 100 compares the copy destination address information and the copy source address information with the copy area information latched in the copy area latch circuit 117. Then, if the result obtained by the comparison is within a predetermined area, the memory subsequently outputs the copy address information, and if the result indicates the address information is outside the area, the memory stops outputting the copy address information.

The output means 119 outputs the copy source address information output from an address generation circuit 118 to the SRAM 200 as a copy source via the common address terminal 113.

How the aforementioned constitutional components operate will be explained below. That is, the command control circuit 111 generates a mode signal within the flash memory 100 by receiving a command from outside via the address bus 400 and the data bus 500.

The control circuit 112 receives the mode signal generated by the command control circuit 111 and controls a variety of automated operations within the flash memory 100 and the operational status of the flash memory 100. Note that in the flash memory, write and erase operations are automatically performed by the control from the control circuit illustrated herein. The write and erase operations are performed on the memory cell while verifying whether write and erase are correctly performed, respectively.

The input means 114 receives a signal from outside via the common address terminal 113. Note that the input means 114 does not allow the signal from outside to enter the memory when the control signal from the control circuit is in a non-active state, and allows the signal from outside to enter the memory when the control signal is in an active state.

The copy source address latch circuit 115 latches the address initiation value associated with an address space of the SRAM 200. Upon entry of command into the memory, the circuit 115 receives an address from the external processor 300. When the flash memory 100 initiates an automated copy cycle, the circuit 115 outputs to the SRAM 200 an address beginning with the address initiation value and data is read from the SRAM 200. The circuit 115 automatically increments an address value with the address space until the value reaches a value defined for a copy area.

The copy destination address latch circuit 116 latches the address initiation value associated with an address space of the flash memory unit 120 and upon entry of a command into the memory, receives an address from the external processor 300. When the flash memory 100 initiates an automated copy cycle, data is read from the SRAM 200 and then a write operation is performed on the flash memory unit 120 beginning with the address initiation value, and the circuit 116 automatically increments an address value with the address space until the value reaches a value defined for a copy area.

The copy area latch circuit 117 latches data indicative of how many times (copy area) the address value is incremented.

The address generation circuit 118 first outputs a copy source address when the circuit 118 reads copy data from the SRAM 200. Upon completion of reading of the copy data from the SRAM 200, the circuit 118 outputs an address so that data is written to the flash memory unit 120. Upon completion of writing of the data to the flash memory unit 120, the circuit 118 outputs the value calculated by incrementing the copy source address by one so that data is read from the SRAM 200.

Upon completion of reading of data from the SRAM 200, the circuit 118 outputs the value calculated by incrementing the copy destination address by one so that data is written to the flash memory unit 120. This operation is repeatedly performed until the copy destination address reaches the value stored in the copy area latch circuit 117.

The output means 119 outputs a signal within the flash memory 100 to the outside via the common address terminal 113. Note that when a control signal from the control circuit 112 is in a non-active state, the means 119 does not output a signal to the outside, but outputs a signal when the control signal in an active state.

The flash memory 100 having the aforementioned configuration and constructed in accordance with the invention operates as follows. When performing a write operation in order to copy data from the SRAM 200 coupled to and located outside the memory to the flash memory unit 120, the memory verifies by itself whether the write operation has completed and based on the verification, reads subsequently needed information (data).

How the memory verifies by itself is as follows. That is, when a copy command is implemented, the flash memory 100 previously stores therein desired copy area information, and every time a copy operation is performed, compares a copy address to be implemented and previously stored information indicative of a copy area with each other. Then, it verifies whether the copy address to be implemented is within or outside the copy area. When the copy address is outside the copy area, the memory verifies that a write operation has completed.

Subsequently, how the flash memory according to the first embodiment operates will be explained below.

Figure 2:
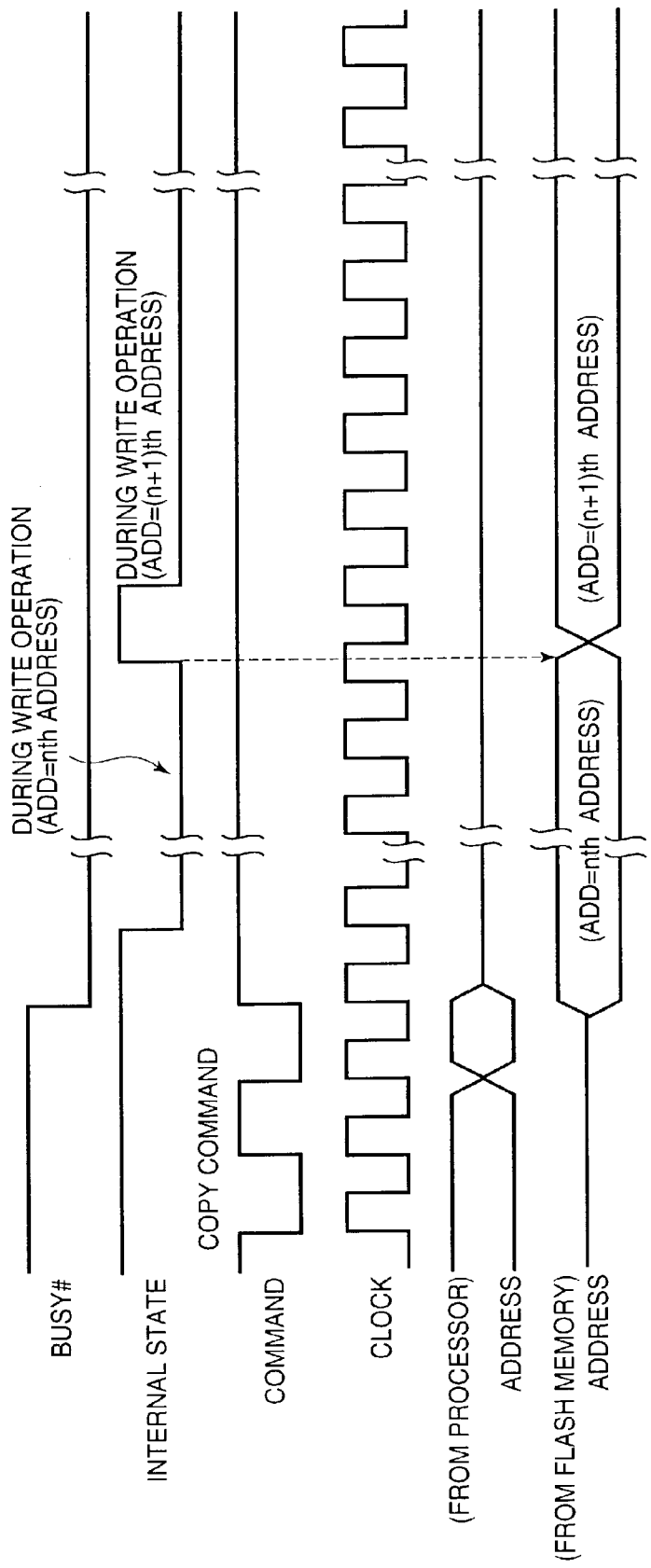
FIG. 2 is a timing chart diagram to explain the first embodiment.

FIG. 2 is a timing chart diagram to explain the first embodiment and illustrates the case where data stored within a specific area of the SRAM 200 is copied to the corresponding area of the flash memory unit 120 incorporated within the flash memory 100. In this case, first, the processor 300 supplies copy address information along with a copy command to the flash memory 100 via the address bus 400. The command control circuit 111 analyzes the supplied command and then supplies the command to the control circuit 112.

Based on the supplied command, the control circuit 112 changes the Ready/Busy# signal to a low level and then gives information indicating the memory is being in a write state to the processor 300.

Furthermore, address information is supplied to the input means 114 via the common address terminal 113 and in response to a control signal input from the control circuit 112, the input means 114 extracts copy source address information, copy destination address information and copy area information as address information, and correspondingly, delivers those information to the copy source address latch circuit 115, the copy destination address latch circuit 116 and the copy area latch circuit 117.

After the copy source address latch circuit 115, the copy destination address latch circuit 116 and the copy area latch circuit 117 each receive the corresponding information, those circuits latch the delivered information and simultaneously output the information to the address generation circuit 118.

The address generation circuit 118 supplies the copy destination address information to the flash memory unit 120 by way of a path denoted by a solid arrow and simultaneously supplies the copy source address information to the SRAM 200 via the output means 119 by way of a path denoted by a broken arrow.

Based on the supplied copy source address information (ADD=nth address), the SRAM 200 supplies data as copy data stored in the memory cell corresponding to the address "ADD=nth address" to the flash memory 100 via the data bus 500.

The flash memory 100 performs a copy operation (or implements a data program) by writing the supplied copy data to the memory cell contained in the flash memory unit 120 and corresponding to the address "ADD=nth address" based on the copy destination address information (ADD=nth address) previously retrieved to the memory.

It should be noted that although in the embodiment, how data is sequentially copied is described, the address generation circuit 118 compares the copy source address information and the copy destination address information with the copy area information latched in the copy area latch circuit 117 at every copy operation.

When a result of the comparison indicates that both the copy source address information and the copy destination address information are within the copy area, each address contained in those information is incremented by one, and a copy operation is repeatedly performed until the copy source address information and the copy destination address information coincide with the address information within the copy area. In contrast, when the copy source address information and the copy destination address information exceed the address within the copy area, the data copy operation terminates.

Figure 3:
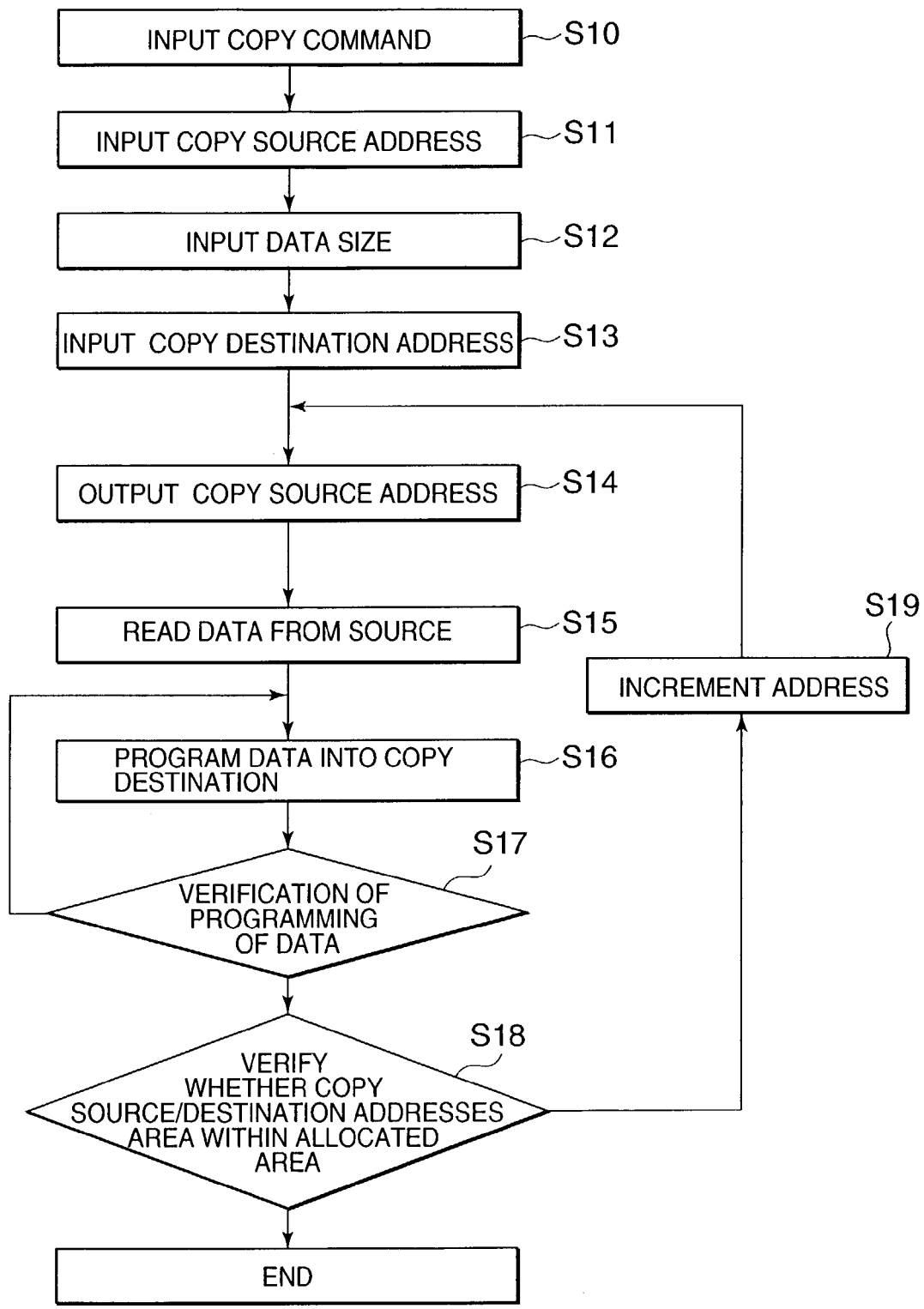
FIG. 3 is a flow chart diagram illustrating how a data write operation is controlled in accordance with the invention.

Referring to FIG. 3 illustrating a flow chart diagram to explain how the above-described data write operation is controlled in accordance with the invention, first, the processor 300 carries out a copy command (processing step S10).

Subsequently, the command control circuit 111 analyzes the source address from which data is to be copied from the SRAM 200 as a copy source, the destination address to which data is to copied and the copy area, and the control circuit 112 determines locations in which those information are to be latched and then those information are latched respectively in the copy source address latch circuit 115, the copy destination address latch circuit 116 and the copy area latch circuit 117 (processing steps S11, S12)

After implementation of the processing steps S11, S12 as latch processing, the address generation circuit 118 generates the copy source address information and supplies the information to the SRAM 200 (processing step S14).

Based on the generated address, data is automatically read from the memory cell of the SRAM 200 as a copy source (processing step S15).

The data read from the SRAM 200 is captured in the flash memory unit 120 as a copy destination and is written to a memory address as a copy destination corresponding to the memory cell of the SRAM 200 (processing step S16).

When a verification processing step S17 for verifying whether the write to the memory address is correctly carried out has completed, the copy source address and the copy destination address each are compared with the copy area latched in the latch processing step S12 (processing step S18).

When a result of the comparison indicates both addresses are within the copy area, data is read from the SRAM 200 as a copy source and the individual addresses within the flash memory unit 120 as a copy destination. Then, the SRAM 200 as a copy source are incremented by one and further the write operation is continued (processing step S19). When a result of the comparison indicates both addresses are outside the copy area, the copy processing terminates.

As described above, when the copy from sequential area within the SRAM 200 to sequential area within the flash memory unit 120 of the flash memory 100 is performed, the copy source address information, the copy destination address information and the copy area are latched respectively in the copy source address latch circuit 115, the copy destination address latch circuit 116 and the copy area latch circuit 117. Then, address data is output in order beginning with the least significant address via the common address terminal 113, and data necessary for a copy operation is read from the SRAM 200. The data read therefrom is latched in the flash memory 100 and then written to the memory cell of the flash memory unit 120.

At this point, the write operation is generally characterized in that only one-time write operation does not ensure that data has correctly been written to the memory cell of the flash memory unit 120. Accordingly, a verification operation for verifying whether data has correctly been written to the desired memory cell needs to internally be performed (programming of data).

Upon completion of the write to the corresponding address, the address information is output via the common address terminal 113 to read the subsequent address and then data necessary for the write operation is read from the SRAM 200. The aforementioned operation is automatically performed on the copy area.

Therefore, although the write to the flash memory 120 conventionally needs an operation for writing data to the subsequent address after verification of completion of the write operation, the flash memory according to the invention need not verification of completion of the write operation and also need not commands for verification and write operations, advantageously reducing a time interval required for a write cycle.

That is, since the flash memory according to the invention verifies by itself completion of a write operation and based on a result of the verification, reads data necessary for the subsequent operation, the memory need not cool down an internal power supply, verify completion of write operation through the use of an external device and retrieve a write command from an external device, reducing a time interval required for a copy cycle.

Figure 4:
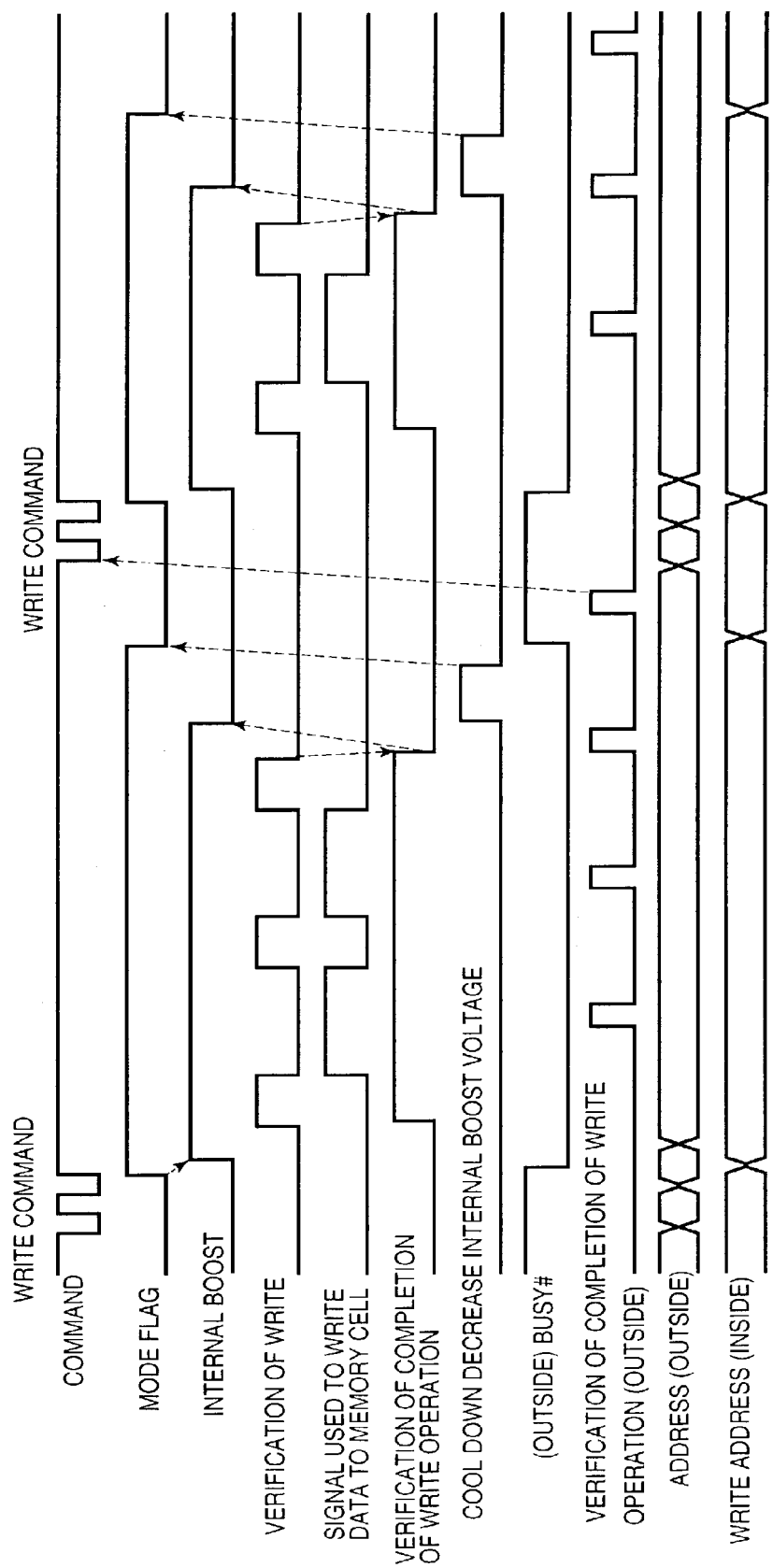
FIG. 4 is a diagram illustrating how a flash memory without copy means that is employed in the invention performs a copy operation.

For instance, referring to FIG. 4 illustrating how the flash memory without the copy means that is employed in the invention operates, when a command is implemented and a mode flag becomes an active state accordingly, an internal boost signal rises.

Furthermore, when a write verification operation is carried out, a write signal to the memory cell and a verification signal alternately becomes active. When the verification signal to verify the write to the memory cell is allowed to pass and a write completion verification signal becomes a low level, an internal boost signal becomes a low level, stopping boosting an internal voltage and simultaneously, an internal boost cool down signal becomes a high level, allowing an internal cool down operation to start.

After a cool down duration, the mode flag becomes a low level, giving to the outside an indication of the change of the state of the flash memory to "Ready." The signal giving the indication is represented by Busy# at high level.

When the internal boost cool down is again carried out to make the mode flag inactive and then the mode flag becomes a low level and a Ready/Busy# signal becomes a high level, i. e., a Ready state, and further when the subsequent command is implemented, an operation similar to the aforementioned operation is repeatedly performed.

Moreover, an external device outside the flash memory needs to verify that the memory changes to the Ready state and therefore, the external device inputs to the memory the subsequent command after the verification.

Figure 5:
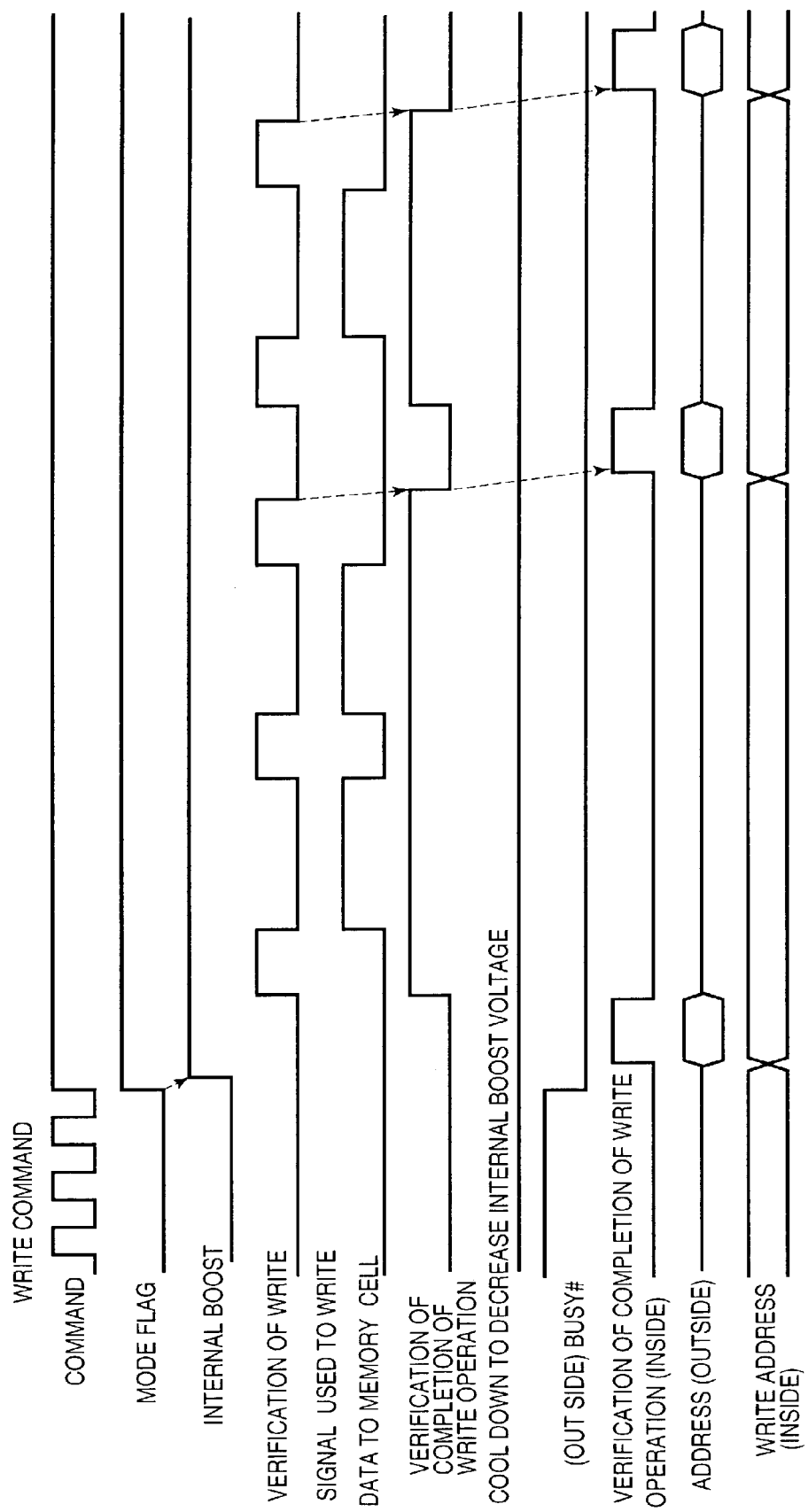
FIG. 5 is a diagram illustrating a flash memory employing write means in accordance with the invention performs a copy operation.

In contrast, when employing the write means according to the invention in a flash memory, the flash memory performs a copy operation according to the timing chart shown in FIG. 5 illustrating the copy operation of the memory. That is, once a command is implemented, the memory verifies by itself completion of write operation and based on the verification of the completion, repeatedly performs an operation for retrieving the subsequent data to be copied and then copying the data. Accordingly, as described above, the memory need not cool down an internal power supply, verify completion of write operation through the use of an external device and retrieve a write command from an external device, reducing a time interval required for a copy cycle.

In general, when writing data to one address, a flash memory needs about 10 microseconds per write cycle. Therefore, when a command cycle takes 100 nanoseconds, execution of a write operation needs two command cycles, i. e., 200 nanoseconds, meaning that a time interval required to write data to one address can be reduced to a fiftieth of 100 microseconds. In case of a system that employs a 1 microseconds command cycle, a time interval required to write data to one address can be reduced to a fifth of 100 microseconds.

A detailed example is as follows. That is, for example, assume that 4 Mbytes of data is copied from the SRAM 200 to the flash memory in divide by 16 mode.

Assuming that (a time interval required for verification of completion of write operation)+(a time interval required for implementation of command)=200 nanoseconds, a time interval represented by the following equation is reduced.

$2 \times M$(the number of times)*200 (ns)=4.194.times-$E$.sup.+8 (ns)=419.4304 (ms)

Furthermore, another example is calculated as follows. In case of a system that employs relatively long command cycle, one command cycle takes about 1 microseconds and therefore, a time interval represented by the following equation is reduced.

$2 \times M$(the number of times)*(microseconds)=4194304 (microseconds)=4 (s)

Moreover, for a duration of a copy operation performed within a copy area, the processor 300 shown in FIG. 1 need not access the flash memory 100 and the SRAM 200, allowing the processor to carry out other processing.

Additionally, when a memory supplier carries out a write operation as a service in a plant, etc., the supplier conventionally needs a ROM writer. However, when employing the function provided by the invention and preparing a flash memory as a copy source, a duplicate chip can automatically be produced by copying one chip to the other chip.

Figure 6:
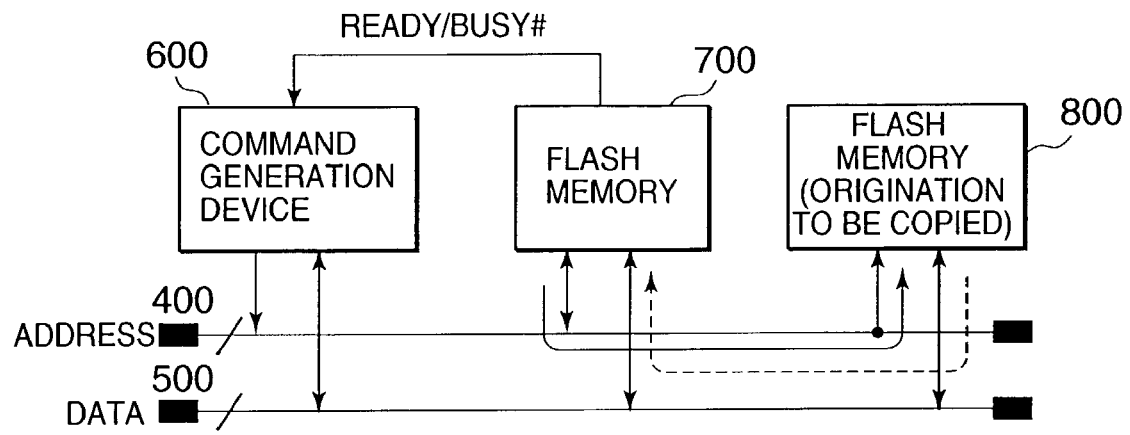
FIG. 6 is a diagram illustrating the configuration that allows a write operation to be performed using a ROM writer.

Still furthermore, in case of a write operation performed using a ROM writer and shown in FIG. 6, a command generation device 600, a flash memory 700 as a copy destination and a flash memory 800 as a copy source are in communication with one another via an address bus 400 and a data bus 500.

In response to a copy command supplied from the command generation device 600, the flash memory 700 as a copy destination supplies address information indicative of an address in which data to be copied is stored to the flash memory 800 as a copy source via the address bus 400 and simultaneously, makes a Ready/Busy# signal in a Ready state become a Busy state and then supplies the signal in a Busy state to the command generation device 600.

Based on the supplied address information, the flash memory 800 transmits the data stored therein to the flash memory 700 via the data bus 500. The flash memory 700, in turn, copies the transmitted data to a memory cell thereof. Thus, employment of the function provided by the invention eliminates need for a ROM writer.

Furthermore, when performing selection of flash memory chip, it is required to write a test pattern to a flash memory and then inspect whether the flash memory operates correctly. In this case, conventionally, the test pattern is written using a tester and it takes a long time to perform the write operation.

Figure 7:
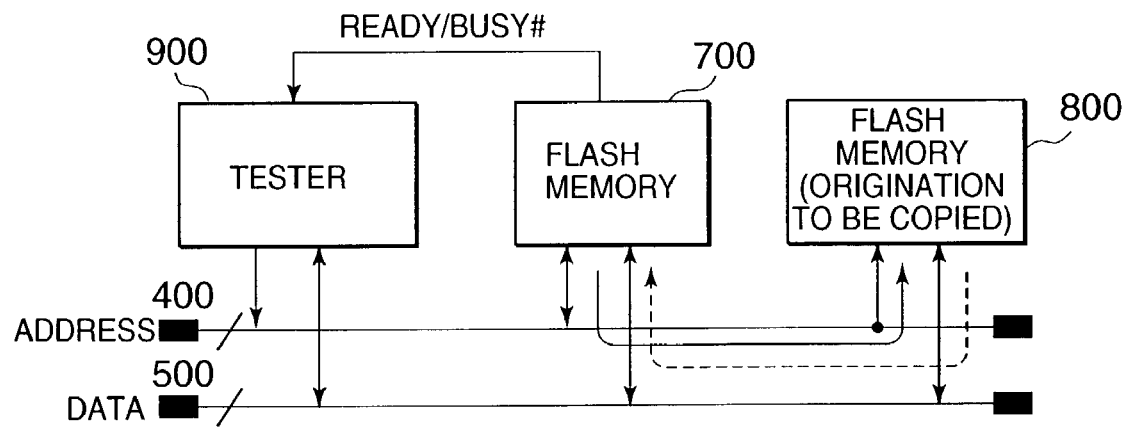
FIG. 7 is a diagram illustrating the configuration that allows a write operation to be performed using a tester.

That is, referring to FIG. 7 illustrating how the write operation is performed using the tester, a tester 900, a flash memory 700 as a copy destination and a flash memory 800 as a copy source are in communication with one another via an address bus 400 and a data bus 500.

In response to a copy command supplied from the tester 900, the flash memory 700 as a copy destination supplies address information indicative of an address in which data to be copied is stored to the flash memory 800 as a copy source via the address bus 400 and simultaneously, makes a Ready/Busy# signal in a Ready state become a Busy state and then supplies the signal in a Busy state to the tester 900.

Based on the supplied address information, the flash memory 800 transmits the data stored therein to the flash memory 700 via the data bus 500. The flash memory 700, in turn, copies the transmitted data to a memory cell thereof.

Thus, when employing the function provided by the invention and preparing a flash memory 800 as a copy source, a duplicate chip can automatically be produced by copying one chip to the other chip, reducing a time interval required for selection of memory chip.

Figure 8:
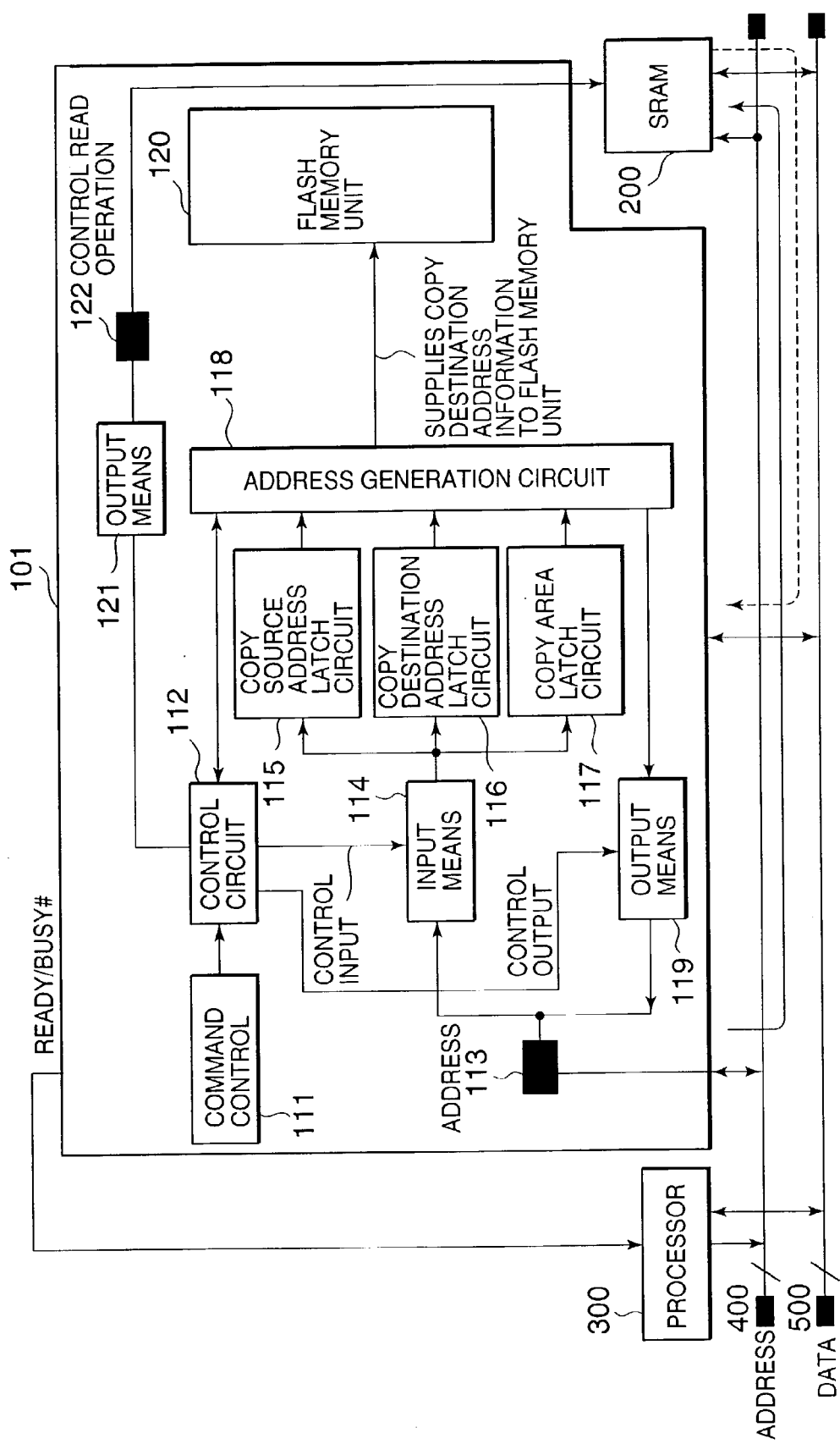
FIG. 8 is a diagram illustrating the configuration of a second embodiment.

Referring to FIG. 8 illustrating the configuration of a second embodiment, the difference between the first and second embodiments is that a flash memory 101 of the second embodiment has output means 121 for outputting a control signal supplied from a control circuit 112 and an external output terminal 122 in addition to the flash memory of the first embodiment and is configured to supply the control signal to a control terminal of an SRAM 200. The remaining configuration of the second embodiment is the same as that of the first embodiment and therefore, the explanation thereof is omitted herein.

The embodiment is provided to further improve a read operation performed on a storage device, such as the SRAM 200, that is coupled to and located outside of the memory.

That is, a control circuit 112 outputs a control signal used to stop supplying circuit current to the SRAM 200 as a copy source that is coupled to and located outside the memory in order to prevent consumption of current of the memory from increasing, and supplies the signal to the SRAM 200 via the output means 121 and the external output terminal 122. Thus, the flash memory of the embodiment supplies current to the SRAM only when the memory accesses the SRAM to read data therefrom and stops supplying current to the SRAM when the memory does not access the SRAM.

Application of the aforementioned configuration to the flash memory makes the memory access the SRAM 200 only when the memory needs to access and suppresses power consumption of the SRAM 200 when the memory does not access the SRAM.

As is already described, also in the second embodiment, the memory need not cool down an internal power supply, verify completion of write operation through the use of an external device and retrieve a write command from an external device, reducing a time interval required for a copy cycle.

Figure 9:
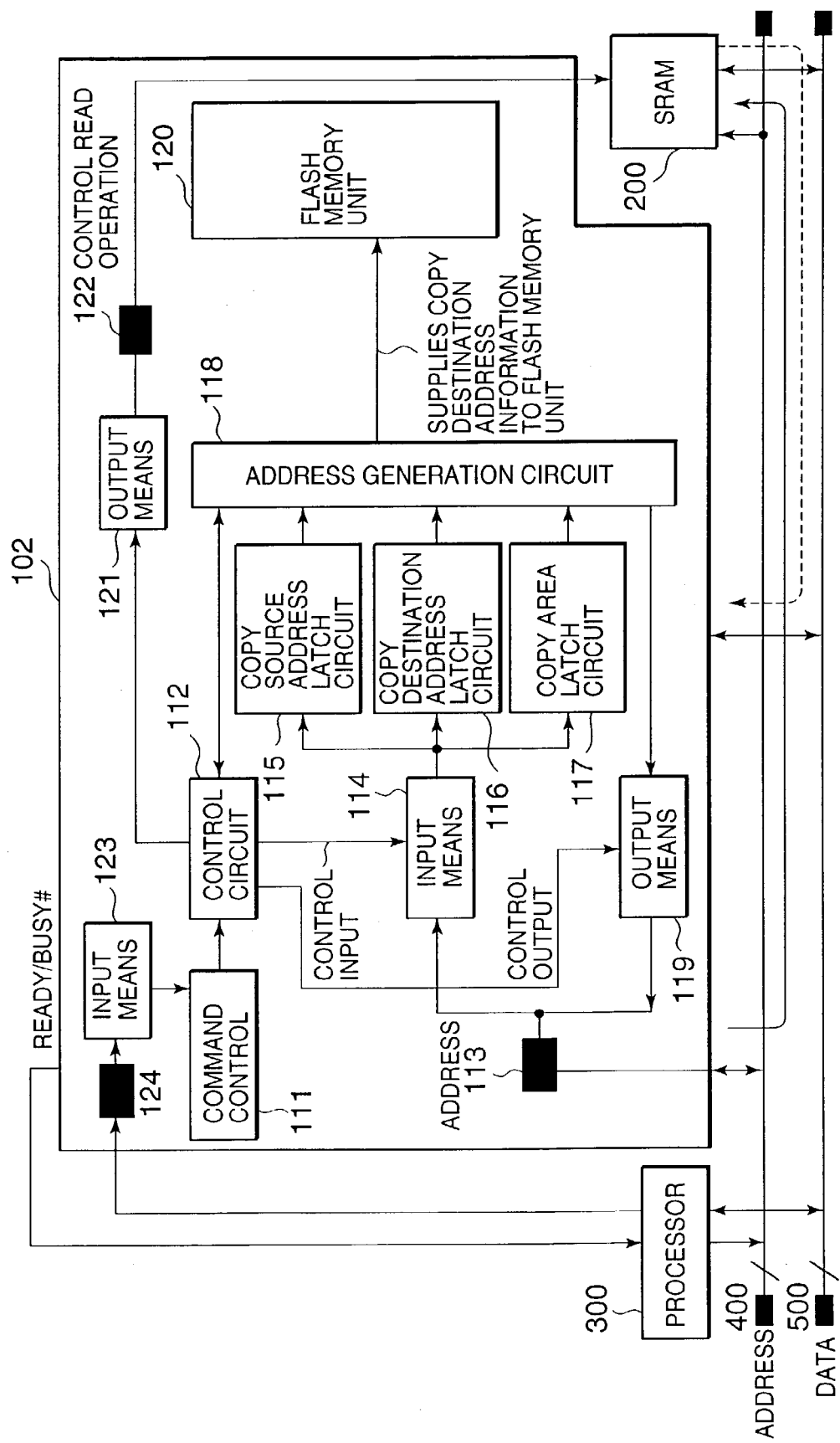
FIG. 9 is a diagram illustrating the configuration of a third embodiment.

Referring to FIG. 9 illustrating the configuration of a third embodiment, the difference between the second and third embodiments is that a flash memory 102 of the third embodiment has an external connection terminal 124 and input means 123, the input terminal of which is connected to the connection terminal and the output terminal of which is coupled to a command control circuit 111, in addition to the flash memory of the second embodiment, and is configured to control a command control circuit 111 using a processor 300 that is provided outside the memory. The remaining configuration of the third embodiment is the same as that of the second embodiment and therefore, the explanation thereof is omitted.

The flash memory constructed as described above operates as follows. That is, when the processor 300 is using an address bus and a data bus, the processor controls the command control circuit 111 via the input means 123 and then controls the control circuit 112 via the command control circuit 111. Additionally, the processor makes a control signal output from the control circuit 112 become an active state in order to make output means 119 become an inactive state. In corporation with the control circuit 112, the command control circuit 111 controls the flash memory 102 utilizing the inactive state of the output means 119 so that the memory does not access the SRAM 200.

As is already described, also in the third embodiment, the memory need not cool down an internal power supply, verify completion of write operation through the use of an external device and retrieve a write command from an external device, reducing a time interval required for a copy cycle.

Figure 10:
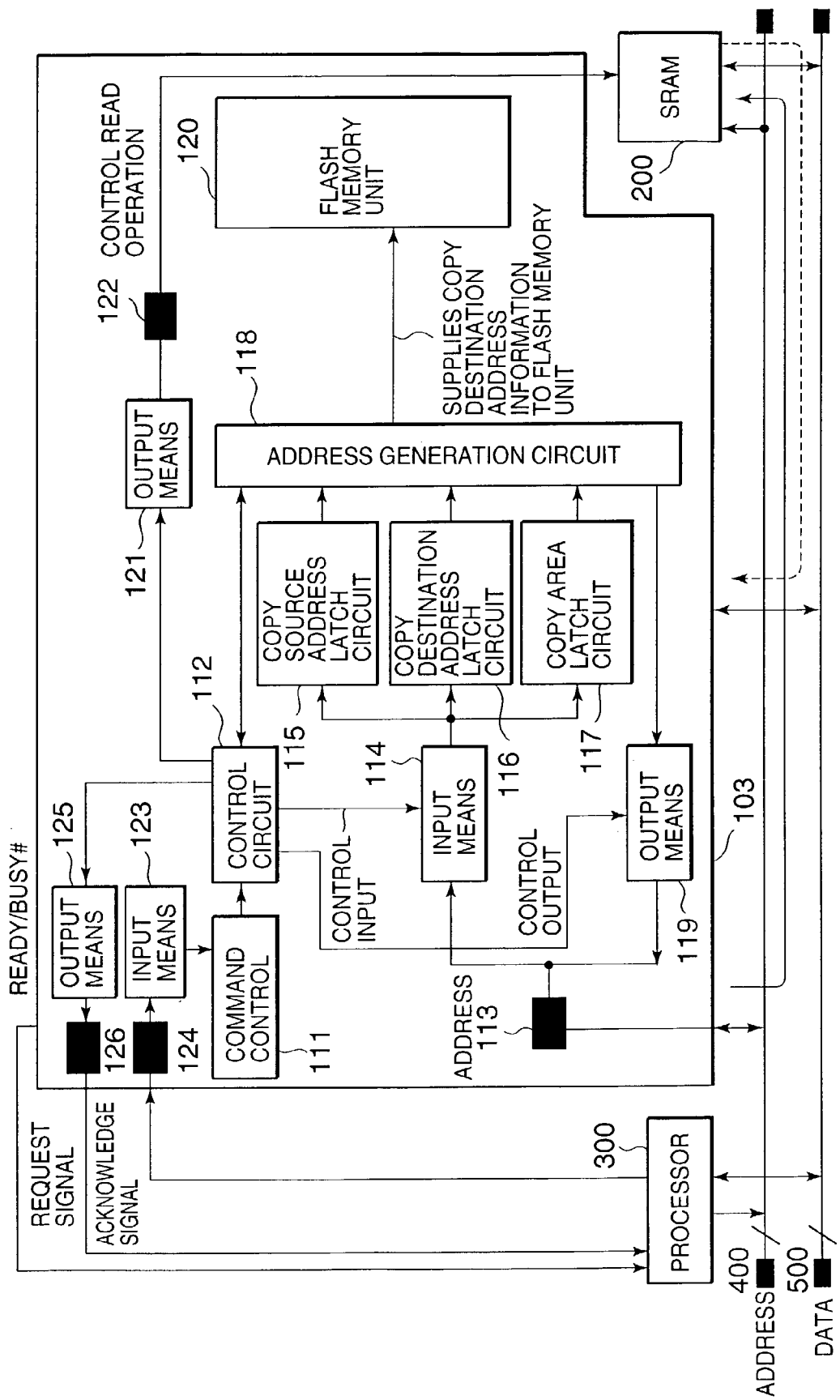
FIG. 10 is a diagram illustrating the configuration of a fourth embodiment.

Referring to FIG. 10 illustrating the configuration of a fourth embodiment, the difference between the third and fourth embodiments is that a flash memory 103 of the fourth embodiment has output means 125, the input terminal of which is coupled to a control signal output terminal of a control circuit 112, and an external connection terminal 126 coupled to the output terminal of the output means 125. The remaining configuration of the fourth embodiment is the same as that of the third embodiment and therefore, the explanation thereof is omitted.

The flash memory constructed as described above operates as follows. That is, when the flash memory 103 outputs through the control circuit 112 a request signal, which allows the memory to use bus lines for transmitting an address and data, the signal is supplied to a processor 300 via the output means 125 and the external connection terminal 126. The processor 300 having received the request signal returns an acknowledge signal, which allows the memory at a specific designated time to use the bus lines for transmitting an address and data, to the command control circuit 111 via the external connection terminal 124 and the input means 123. Note that although the embodiment is configured to have the external connection terminal 124 and the input means 123 newly formed therein, instead, the embodiment may employ the circuit scheme which allows the processor 300 provided outside the memory to control the command control circuit 111, as can be seen in the second embodiment.

The command control circuit 111 having received the acknowledge signal supplies a control signal to the control circuit 112 so that the control circuit outputs copy source address information.

The control circuit 112 supplies an output control signal to output means 119 in order to make the output means become an active state and to make an address generation circuit 118 output copy source address information to the address bus 400, thereby allowing the memory to access the SRAM 200 and read therefrom data to be copied.

As is already described, also in the fourth embodiment, the memory need not cool down an internal power supply, verify completion of write operation through the use of an external device and retrieve a write command from an external device, reducing a time interval required for a copy cycle.

Figure 11:
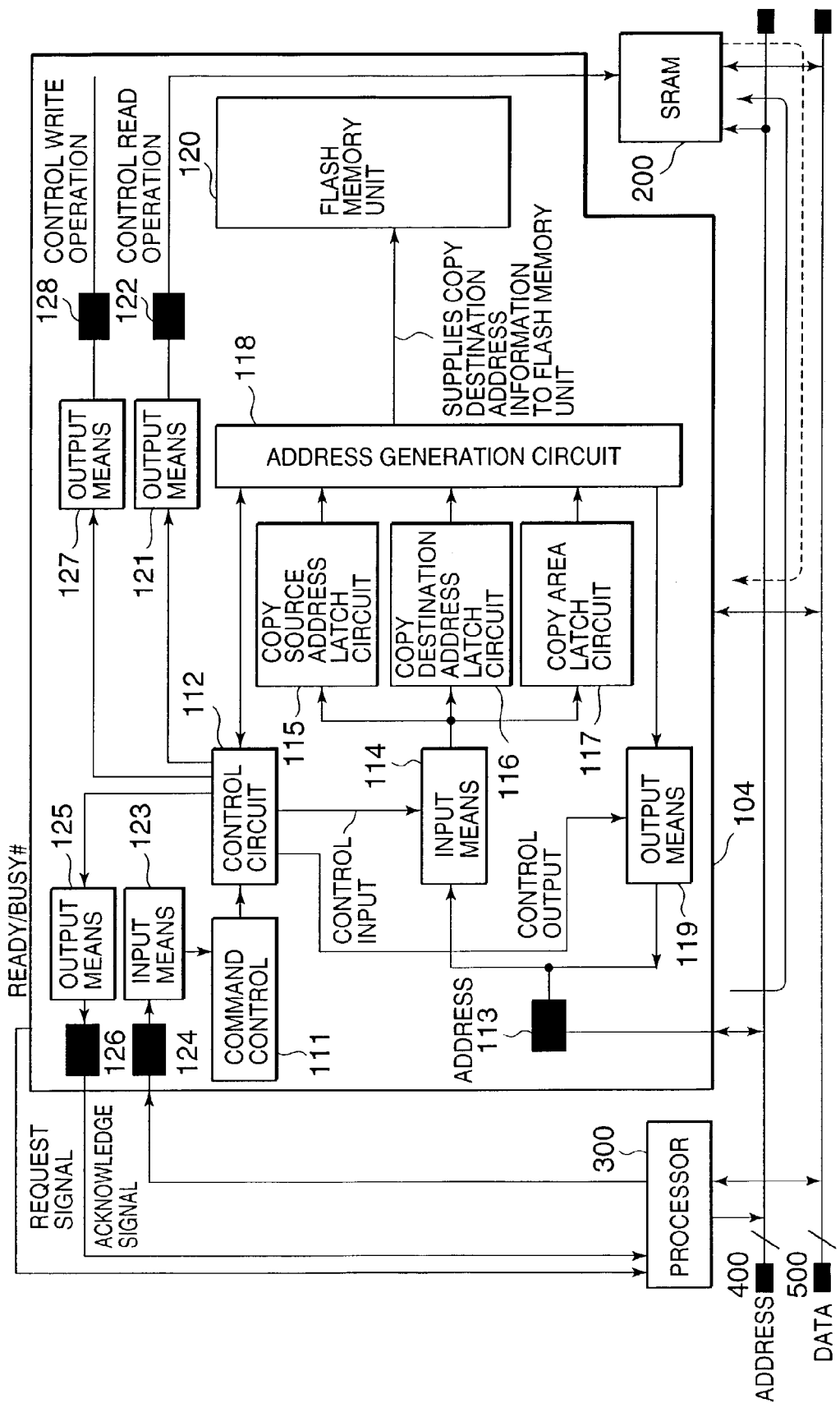
FIG. 11 is a diagram illustrating the configuration of a fifth embodiment.

Referring to FIG. 11 illustrating the configuration of a fifth embodiment, the difference between the fourth and fifth embodiments is that a flash memory 104 of the fifth embodiment has output means 127 for outputting a write control signal supplied from a control circuit 112 and an output terminal 128 in addition to the flash memory of the fourth embodiment, and is configured to supply the write control signal to the other control terminal of the SRAM 200. The remaining configuration of the fifth embodiment is the same as that of the fourth embodiment and therefore, the explanation thereof is omitted.

Although the aforementioned fourth embodiment shown in FIG. 10 is constructed such that the flash memory 103 supplies the read control signal to the SRAM 200 in order to read data from the SRAM, the flash memory of the fifth embodiment is constructed such that the write control signal is newly employed to supply the signal from the memory to the SRAM and further a copy command is employed to allow the flash memory 104 to write data to the SRAM 200, as shown in FIG. 11.

It should be appreciated that since a time when data is written to the SRAM 200 is predetermined, the flash memory 104 may simply output an address, data and a write control signal at the predetermined time.

That is, when the flash memory 104 outputs through the control circuit 112 a request signal, which allows the memory to use bus lines for transmitting an address and data, the signal is supplied to a processor 300 via the output means 125 and the external connection terminal 126. The processor 300 having received the request signal returns an acknowledge signal, which allows the memory to use the bus lines for transmitting an address and data at a specific designated time, to the command control circuit 111 via the external connection terminal 124 and the input means 123.

The command control circuit 111 having received the acknowledge signal supplies a write control signal to the control circuit 112 so that the flash memory 104 writes data to the SRAM 200.

The control circuit 112 supplies an output control signal to output means 119 in order to make the output means 119 become an active state and to make an address generation circuit 118 output write address information to the address bus 400, thereby allowing the memory to access the SRAM 200 and write data to be copied to the SRAM 200.

As described above, also in the fifth embodiment, the memory need not retrieve a write command from an external device, reducing a time interval required for a copy cycle.

A sixth embodiment of the invention will be explained below.

Figure 12:
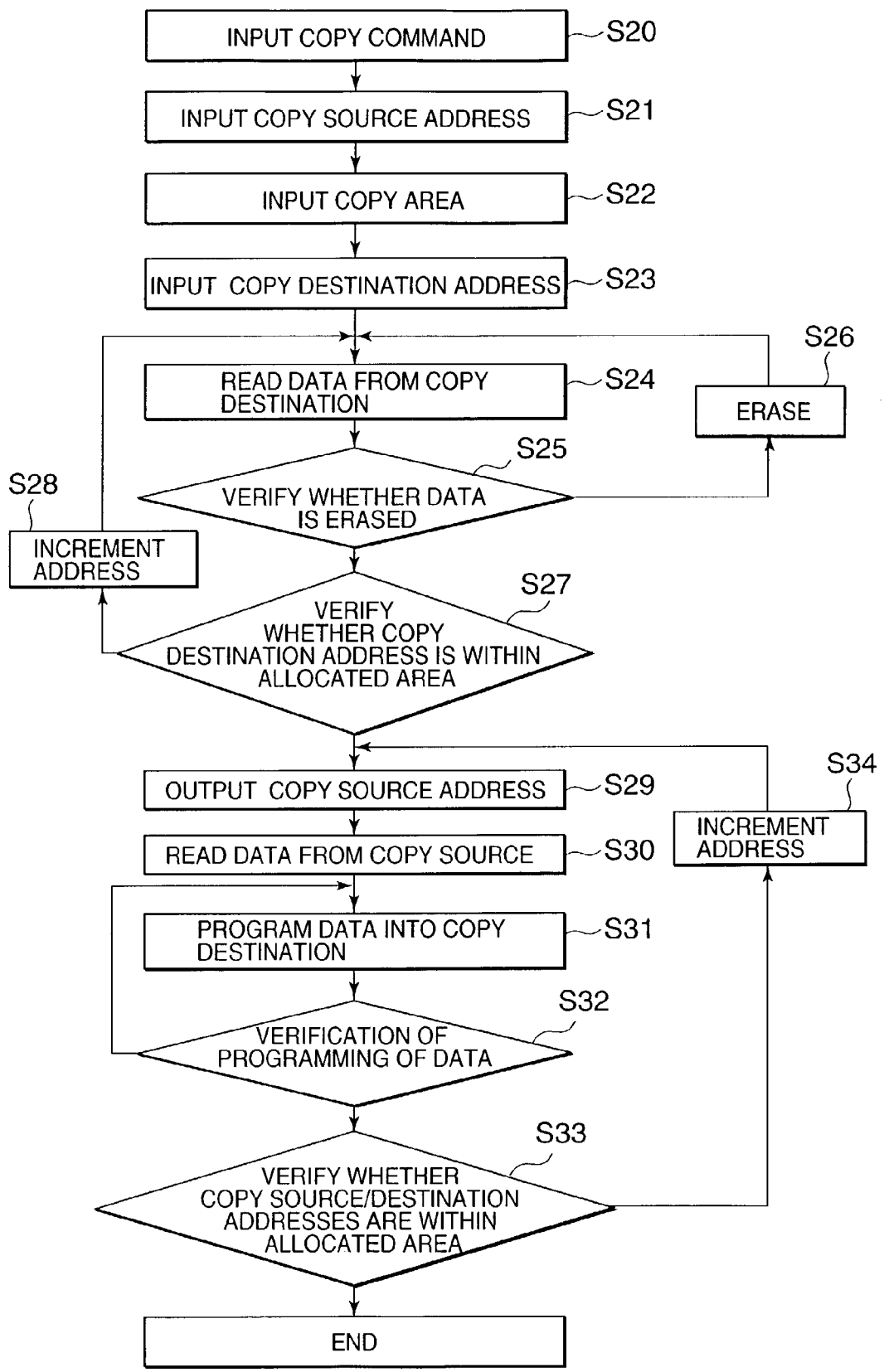
FIG. 12 is a flow chart diagram to explain a sixth embodiment.
Figure 13:
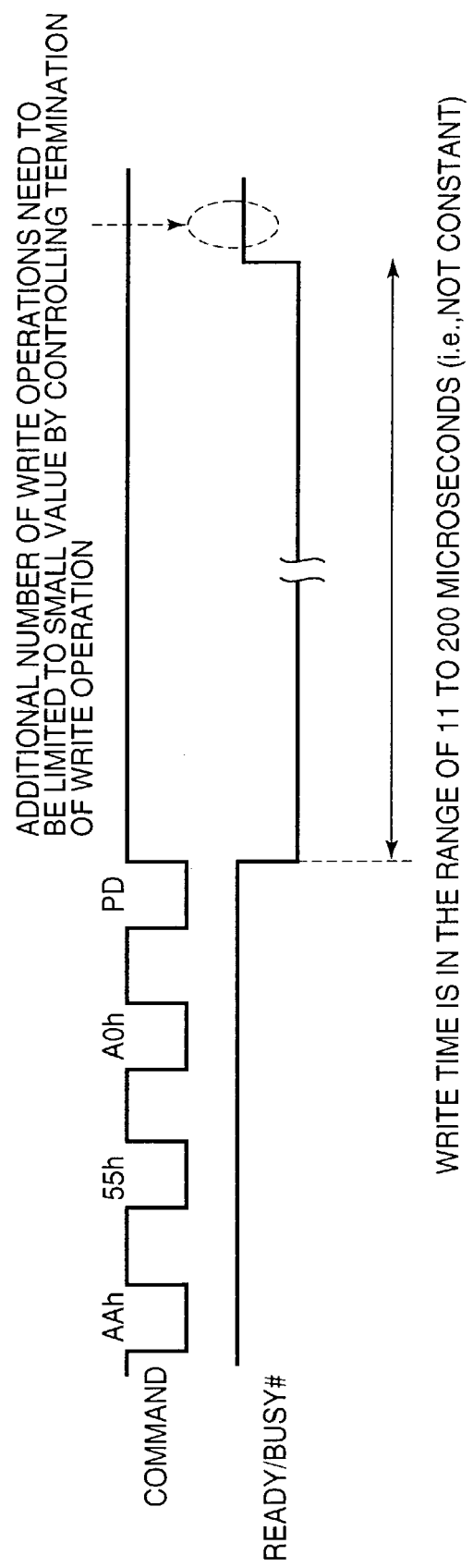
FIG. 13 illustrates a timing chart to explain a write operation performed on the conventional flash memory.
Figure 14:
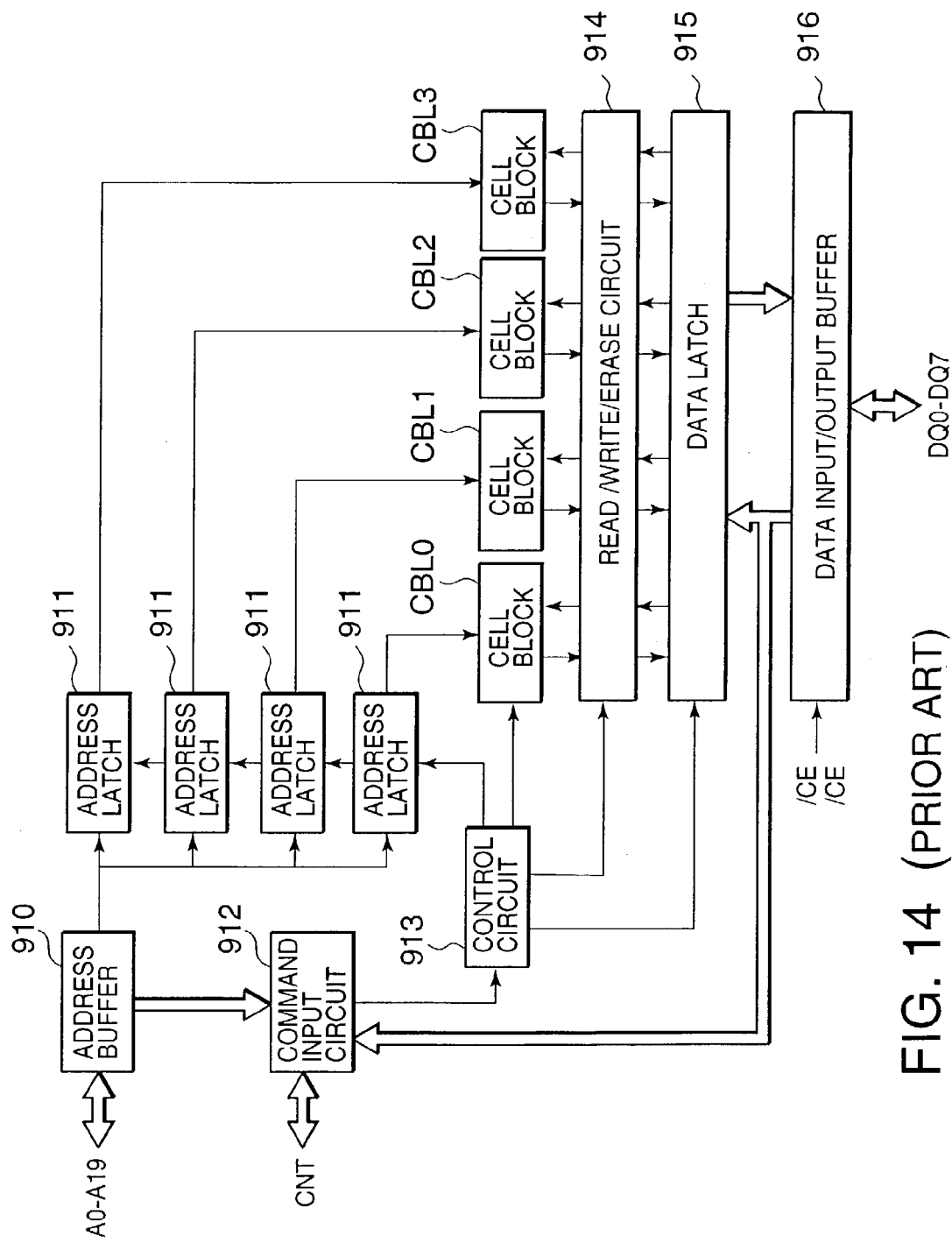
FIG. 14 is a diagram illustrating the configuration of another conventional flash memory.

Referring to FIG. 12 illustrating a flow chart for steps employed in the sixth embodiment, the difference between the flow charts employed in the first and sixth embodiments is that the sixth embodiment has steps S24 to S28 of erasing the copy destination, which steps are provided between the copy destination address input processing S23 and the copy source address output processing S29.

That is, the memory retrieves a copy command from the processor 300 and receives the command (processing step S20) After receipt of the command, the memory receives the copy source address information, the copy area (data size) information and the copy destination address information (processing steps S21 to S23).

Subsequently, the memory reads data from the flash memory unit 120 as a copy destination and verifies the erased state of the unit 120, and then, when the unit 120 is in an un-erased state, the memory erases all data contained in a desired copy area (processing steps S24 to S28).

After erasing of all data contained in the copy area, the flash memory 100 as a copy destination outputs the copy source address information from the address generation circuit 118 to the SRAM 200 as a copy source via the output means 119 and the common address terminal 113, and reads from the SRAM 200 data to be copied (processing steps S29, S30).

The flash memory 100 latches the data read therefrom to its own latch means within the memory, i.e., the copy source address latch circuit 115, the copy destination address latch circuit 116 and the copy area latch circuit 117. Then, the memory writes the data latched in the latch means to the flash memory unit 120 as a copy destination, the address of which is incremented by one, and repeatedly writes the data there to while incrementing the copy source address information by one until the memory completes the data write to the predetermined copy area (processing steps S31 to S 34).

In the aforementioned processing, the memory designates the copy source address from which data is to be copied, the copy area and the copy destination address to which data is to be copied, and latches those information in the corresponding memory locations, and then, writes data to the associated locations within the memory. In this case, generally, the flash memory can perform a write operation in a direction from a "1" to a "0" and cannot perform the same in a direction from a "0" to a "1."

Accordingly, as shown in the processing steps S24 to S28, the memory of the embodiment is configured to previously perform an erase operation on the copy destination before execution of a write operation in order to correctly complete a copy operation.

As described so far, the non-volatile semiconductor memory device of the invention operates so that when the copy command is implemented, the flash memory 100 previously stores the desired copy area information and every time the copy operation is performed, the memory compares the copy address on which the copy operation is performed and the previously stored copy area information with each other. Thereafter, the memory verifies whether the copy address on which the copy operation is performed is within or outside the copy area and then retrieves subsequently necessary information (data) based on the verification. When the memory verifies that the copy address is without the copy area, the memory by itself verifies completion of the write to a copy destination. The flash memory having such self-verification function need not cool down an internal power supply, verify completion of write operation through the use of an external device and retrieve a write command from an external device, reducing a time interval required for a copy cycle.

Furthermore, for a time duration of copy cycle, the processor need not access the flash memory and the SRAM, and therefore, is able to implement other processing.

Moreover, when a memory supplier carries out a write operation as a service in a plant, etc., the supplier conventionally needs a ROM writer. However, when employing the function provided by the invention and preparing a flash memory as a copy source, a duplicate chip can automatically be produced by copying one chip to the other chip.

Still furthermore, employment of a function provided by the invention eliminates need for the use of ROM writer.

Additionally, although it is conventionally required to write a test pattern to the flash memory and then inspect whether the flash memory operates correctly when performing selection of memory chip using a tester, a duplicate chip can automatically be produced by copying one chip to the other chip when employing the function provided by the invention, allowing reduction of a time interval required for selection of memory chip. Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A non-volatile semiconductor memory device comprising:
a copy area latch circuit for latching information therein;
a copy source address latch circuit for latching therein information read from a copy source; and
write control means for comparing said information latched in said copy area latch circuit and said information latched in said copy source address latch circuit with each other, and automatically copying data latched in a source area of said copy source to a destination area of a copy destination, said destination area corresponding to said source area, until said information latched in said copy area latch circuit and said information latched in said copy source address latch circuit become coincide with each other following implementation of a newly provided copy command when data is copied from external storage means as a copy source to a non-volatile memory.

2. A non-volatile semiconductor memory device comprising:
a copy area latch circuit for latching information therein; and
write control means having a function of verification of completion of a write operation and provided to perform a copy operation so that said means initiates a read operation for reading data to be copied from a copy source address designated only one time by a processor coupled to and located outside said memory device following implementation of a newly provided copy command when data is copied from external storage means as a copy source to a non-volatile memory, writes said data to be copied read by said means to an address within a copy destination, increments said copy source address by one after completion of writing of said data to be copied and then reads subsequent data to be copied, increments said copy source address by one after completion of reading of said subsequent data to be copied and then writes said subsequent data to be copied read by said means to an address within said copy destination, and repeats said copy operation until said copy destination address reaches said information latched in said copy area latch circuit.

3. A non-volatile semiconductor memory device comprising:
write control means for performing a data copy operation under conditions provided so that neither a signal indicative of verification of completion of a data write operation nor a write command is supplied from an external storage device as a copy source to a non-volatile memory disposed within a copy destination,
said write control means being constructed such that when data is copied from sequential storage area within said copy source to sequential storage area within said copy destination, said write control means latches address information indicative of addresses within a copy source, address information indicative of addresses within a copy destination and copy area information as latched information in respective latch means within said write control means based on a copy command retrieved from outside, and simultaneously, compares said address information read from said copy source and said copy area information with each other in response to those latched information using address generation means within said write control means, and verifies by itself whether said write operation has completed based on a result obtained by comparing said address information and said copy area information, thereby providing said non-volatile semiconductor memory device with self-verification function.

4. A non-volatile semiconductor memory device comprising:
write control means for performing a data copy operation under conditions provided so that neither a signal indicative of verification of completion of a data write operation nor a write command is supplied from an external storage device as a copy source to a non-volatile memory disposed within a copy destination,
said write control means being constructed such that when data latched in said copy destination is erased before data is copied from sequential storage area within said copy source to sequential storage area within said copy destination, said write control means latches address information indicative of addresses within a copy source, address information indicative of addresses within a copy destination and copy area information as latched information in respective latch means within said write control means based on a copy command retrieved from outside, and simultaneously, compares said address information read from said copy source and said copy area information with each other in response to those latched information using address generation means within said write control means, and verifies by itself whether said write operation has completed based on a result obtained by comparing said address information and said copy area information, thereby providing said non-volatile semiconductor memory device with self-verification function.

5. The non-volatile semiconductor memory device according to claim 1, further comprising a common address terminal for receiving an address designated only one time by a processor coupled to and located outside said memory device upon initiation of a copy operation and outputting address information, needed to copy data from said copy source and used to read data, in order beginning with the least significant address.

6. A non-volatile semiconductor memory device comprising:
command control means for decoding a command from outside;
control means for performing control processing within said memory device in response to an output from said command control means;
a common address terminal for receiving address information supplied only one time from a processor coupled to and located outside said memory device upon initiation of a copy operation and address information read from a storage device coupled to and located outside said memory device;
first input means for outputting said address information received from said processor via said common address terminal as copy destination address information, and further, an address received from said storage device coupled to and located outside said memory device, and data size as copy source address information and copy area information, respectively;
a copy source address latch circuit for latching therein said copy source address information;
a copy destination address latch circuit for latching therein said copy destination address information;
a copy area latch circuit for latching therein said copy area information;
an address generation circuit for generating a destination address indicative of a copy destination and a source address indicative of a copy source using said copy source address latch circuit, said copy destination address latch circuit and said copy area latch circuit; and
first output means for outputting said source address indicative of said copy source to said address terminal.

7. The non-volatile semiconductor memory device according to claim 6, further comprising second output means for outputting a control signal used to stop supplying circuit current to said storage device as a copy source coupled to and located outside said memory device in order to prevent consumption of current of said memory device from increasing.

8. The non-volatile semiconductor memory device according to claim 7, further comprising second input means used to allow said control signal to pass through said second input means in order to prevent non-volatile semiconductor storage means as said copy destination from accessing said storage device coupled to and located outside said memory device in response to a control command output from said processor when said processor is using an address bus and a data bus.

9. The non-volatile semiconductor memory device according to claim 8, further comprising third output means for outputting from said control circuit a request signal used to allow said memory device to use said address bus and said data bus to said processor, wherein said second input means receives an acknowledge signal used to allow said memory device to use said address bus and said data bus, and reads address information indicative of an address of said copy source from said storage device coupled to and located outside said memory device in response to said acknowledge signal.

10. The non-volatile semiconductor memory device according to claim 9, further comprising third output means provided for outputting a write control signal supplied from said control means and constructed such that said write control signal is supplied to the other terminal of said storage device coupled to and located outside said memory device, wherein said non-volatile semiconductor storage means is able to write copy data to said storage device coupled to and located outside said memory device.

11. The non-volatile semiconductor memory device according to claim 6, wherein prior to writing predetermined data to a memory cell of a predetermined area previously determined within a copy destination, said copy operation is performed after data within said memory cell of said predetermined area is previously erased.

12. The non-volatile semiconductor memory device according to claim 6, wherein a copy command is previously set and said memory device designates and latches said source address indicative of a copy source, said copy area and said destination address indicative of a copy destination following implementation of said copy command, and then, outputs said source address generated by said address generation means to said copy source via said first output means based on said addresses latched in said memory device, and further, automatically reads data from said copy source upon receipt of said address output via said first output means.

13. The non-volatile semiconductor memory device according to claim 6, wherein said memory device automatically produces a duplicate chip by copying data representative of one chip from memory cells within said copy source to memory cells within said copy destination without using a ROM writer.

14. The non-volatile semiconductor memory device according to claim 6, wherein instead of writing data to said copy destination using a tester, said memory device automatically produces a duplicate chip by copying data corresponding to one chip from memory cells within said copy source to memory cells within said copy destination.

15. The non-volatile semiconductor memory device according to claim 2, further comprising a common address terminal for receiving an address designated only one time by a processor coupled to and located outside said memory device upon initiation of a copy operation and outputting address information, needed to copy data from said copy source and used to read data, in order beginning with the least significant address.

16. The non-volatile semiconductor memory device according to claim 3, further comprising a common address terminal for receiving an address designated only one time by a processor coupled to and located outside said memory device upon initiation of a copy operation and outputting address information, needed to copy data from said copy source and used to read data, in order beginning with the least significant address.

17. The non-volatile semiconductor memory device according to claim 4, further comprising a common address terminal for receiving an address designated only one time by a processor coupled to and located outside said memory device upon initiation of a copy operation and outputting address information, needed to copy data from said copy source and used to read data, in order beginning with the least significant address.

* * * * *